(12) United States Patent
Haye

(10) Patent No.: US 10,430,531 B2
(45) Date of Patent: Oct. 1, 2019

(54) MODEL BASED SYSTEM MONITORING

(71) Applicant: United Technologies Corporation, Farmington, CT (US)

(72) Inventor: Sheridon Everette Haye, Mansfield, CT (US)

(73) Assignee: UNITED TECHNOLOGIES CORPORATION, Farmington, CT (US)

( * ) Notice: Subject to any disclaimer, the term of this patent is extended or adjusted under 35 U.S.C. 154(b) by 472 days.

(21) Appl. No.: 15/042,323

(22) Filed: Feb. 12, 2016

(65) Prior Publication Data

US 2017/0235857 A1 Aug. 17, 2017

(51) Int. Cl.
G06F 17/50 (2006.01)
G05B 23/02 (2006.01)
G06N 3/08 (2006.01)

(52) U.S. Cl.
CPC ..... *G06F 17/5009* (2013.01); *G05B 23/0256* (2013.01); *G05B 23/0283* (2013.01); *G06F 17/5086* (2013.01); *G06N 3/088* (2013.01)

(58) Field of Classification Search
CPC ........... H02J 3/14; G01M 15/14; G06F 21/55; G06F 17/5009; G05B 13/026; G01N 3/00
See application file for complete search history.

(56) References Cited

U.S. PATENT DOCUMENTS

| | | | |
|---|---|---|---|
| 7,181,374 B1 * | 2/2007 | Mosterman | G05B 23/021 700/1 |
| 2002/0157478 A1 * | 10/2002 | Seale | G01N 3/00 73/789 |
| 2009/0113049 A1 * | 4/2009 | Nasle | G05B 13/026 709/224 |
| 2009/0254286 A1 * | 10/2009 | Tulyani | G06F 17/5009 702/34 |
| 2010/0076729 A1 | 3/2010 | Davis et al. | |
| 2013/0253898 A1 * | 9/2013 | Meagher | G06F 17/5009 703/18 |
| 2015/0096026 A1 * | 4/2015 | Kolacinski | G06F 21/55 726/23 |
| 2015/0369700 A1 * | 12/2015 | Varney | G01M 15/106 73/114.76 |
| 2016/0123175 A1 * | 5/2016 | Mazzaro | G01M 15/14 702/182 |
| 2016/0261115 A1 * | 9/2016 | Asati | H02J 3/14 |

OTHER PUBLICATIONS

EP Application No. 17155677.2 Extended European Search Report dated May 26, 2017, 8 pages.
EP Application No. 17155677.2 Office Action dated Feb. 4, 2019, 3 pages.

* cited by examiner

*Primary Examiner* — Kandasamy Thangavelu
(74) *Attorney, Agent, or Firm* — Cantor Colburn LLP

(57) ABSTRACT

According to an aspect, a method includes configuring a predictive system model with a plurality of component models to correspond with a modeled state of a mechanical system. A set of perturbation inputs is applied to one or more of the component models to produce a plurality of prediction results. The prediction results are compared to a targeted mode of the mechanical system. A set of configuration parameters of the mechanical system is captured in combination with one or more of the perturbation inputs that most closely results in the prediction results matching the targeted mode of the mechanical system.

14 Claims, 4 Drawing Sheets

MODEL BASED SYSTEM MONITORING

BACKGROUND

This disclosure relates to system monitoring, and more particularly to model based monitoring of mechanical systems.

Complex engineered systems including such things as vehicles, jet engines, heating, ventilating, and air conditioning (HVAC) systems and elevators typically are systematically monitored to make sure that faults are detected and flagged early. Several types of sensors are used to monitor physical observable conditions such as temperatures, pressures, levels, rates and vibrations. System health monitoring is commonly distributed among these sensors to detect faults when failure conditions occur. Monitoring of sensed parameters can be useful to declare general fault conditions, but it can be challenging to isolate the likely causes of the fault conditions and to predict when faults are likely to occur.

BRIEF DESCRIPTION

According to an embodiment, a method includes configuring a predictive system model with a plurality of component models to correspond with a modeled state of a mechanical system. A set of perturbation inputs is applied to one or more of the component models to produce a plurality of prediction results. The prediction results are compared to a targeted mode of the mechanical system. A set of configuration parameters of the mechanical system is captured in combination with one or more of the perturbation inputs that most closely results in the prediction results matching the targeted mode of the mechanical system.

In addition to one or more of the features described above, or as an alternative to any of the foregoing embodiments, further embodiments may include where the modeled state of the mechanical system is a degraded condition of the mechanical system.

In addition to one or more of the features described above, or as an alternative to any of the foregoing embodiments, further embodiments may include where the targeted mode corresponds to an observed condition of the mechanical system from sensor data.

In addition to one or more of the features described above, or as an alternative to any of the foregoing embodiments, further embodiments may include where the predictive system model defines mechanical and fluid interactions between the component models.

In addition to one or more of the features described above, or as an alternative to any of the foregoing embodiments, further embodiments may include where the predictive system model is a reduced order model derived from one or more higher-fidelity design models of the mechanical system.

In addition to one or more of the features described above, or as an alternative to any of the foregoing embodiments, further embodiments may include where associations between fault conditions of the mechanical system and the set of configuration parameters and perturbation inputs are captured in failure mode definitions to reproduce one or more faults.

In addition to one or more of the features described above, or as an alternative to any of the foregoing embodiments, further embodiments may include performing fault trend detection to observe one or more progressive sequences of the configuration parameters and perturbation inputs that result in each of the one or more faults.

In addition to one or more of the features described above, or as an alternative to any of the foregoing embodiments, further embodiments may include where an instance of the predictive system model is implemented in a processing system of the mechanical system and performs fault prediction using the failure mode definitions in real-time.

In addition to one or more of the features described above, or as an alternative to any of the foregoing embodiments, further embodiments may include using a neural network to interpolate conditions between the failure mode definitions.

In addition to one or more of the features described above, or as an alternative to any of the foregoing embodiments, further embodiments may include capturing a history of the prediction results and comparing observed faults of the mechanical system to the prediction results to train the predictive system model.

According to an embodiment, a processing system includes a predictive system model executable by a processor and a model exerciser. The predictive system model includes a plurality of component models configured to correspond with a modeled state of a mechanical system. The model exerciser is operable to apply a set of perturbation inputs to one or more of the component models to produce a plurality of prediction results, compare the prediction results to a targeted mode of the mechanical system, and capture in a memory system a set of configuration parameters of the mechanical system in combination with one or more of the perturbation inputs that most closely results in the prediction results matching the targeted mode of the mechanical system.

In addition to one or more of the features described above, or as an alternative to any of the foregoing embodiments, further embodiments may include where the processing system is integrated with the mechanical system and performs fault prediction using the failure mode definitions in real-time.

Technical effects include data fusion, fault prediction, and interactive monitoring of mechanical systems.

BRIEF DESCRIPTION OF THE DRAWINGS

The subject matter which is regarded as the present disclosure is particularly pointed out and distinctly claimed in the claims at the conclusion of the specification. The foregoing and other features, and advantages of the present disclosure are apparent from the following detailed description taken in conjunction with the accompanying drawings in which:

DETAILED DESCRIPTION

Embodiments develop and utilize a predictive system model that incorporates physical contributions of components of a mechanical system. The predictive system model provides a predictive approach to mechanical system monitoring by capturing mechanical and fluid interactions of components and between components to support relational fault indications. Component fault interactions can be observed by configuring and perturbing the predictive system model to match observed data from sensor reading patterns.

The predictive system model can be a reduced order dynamic model, where known inputs for a known fault and perturbations of components are used to determine a match for an observed condition, such as a fault. Where the mechanical system is a gas turbine engine, examples of known components of the predictive system model can include but are not limited to definitions of bearing stiffness, damper coefficients, fluid viscosity, flow rates, rotor geometries, active oil damper states, oil debris monitoring counts, oil consumption, and the like. Knowledge of interactions between components in the mechanical system can be leveraged to discover various condition indicators that may not be readily apparent. For instance, vibratory energy can be a key indicator of a distressed mechanical system, and as such, the predictive system model may be crafted to account for all the known contributors to a vibration indication such that separate and collective effects of modifications to each contributor can be observed.

Figure 1:
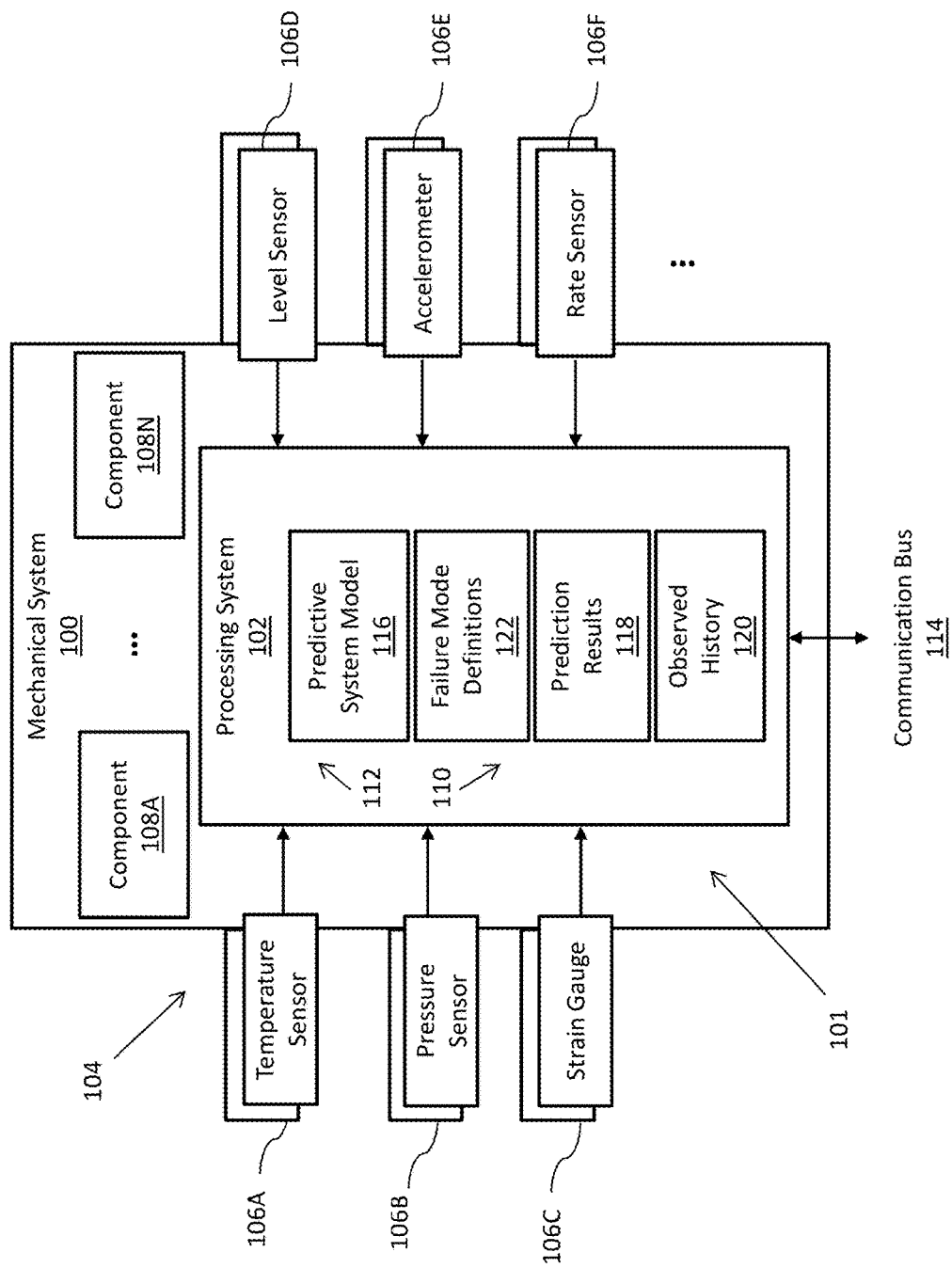
FIG. 1 illustrates a predictive monitoring system for a mechanical system according to an embodiment.

Referring now to the drawings, FIG. 1 illustrates a mechanical system 100 that is monitored by a predictive monitoring system 101 that includes a processing system 102 coupled to a sensor system 104. The sensor system 104 includes a plurality of sensors 106 that are configured to collect diagnostic and operational data related to the mechanical system 100. The mechanical system 100 can be any type of machine or system comprised of a plurality of components 108A-108N subject to detectable and predictable failure modes. For example, the mechanical system 100 can be a vehicle, an engine, an HVAC system, an elevator system, industrial machinery, or the like. In the example of FIG. 1, the sensors 106 monitor a plurality of parameters of the mechanical system 100, such as one or more temperature sensors 106A, pressure sensors 106B, strain gauges 106C, level sensors 106D, accelerometers 106E, rate sensors 106F, and the like.

The processing system 102 can include a memory system 110 to store instructions that are executed by one or more processors 112. The executable instructions may be stored or organized in any manner and at any level of abstraction, such as in connection with a controlling and/or monitoring operation of the sensor system 104. The one or more processors 112 can be any type of central processing unit (CPU), including a microprocessor, a digital signal processor (DSP), a microcontroller, an application specific integrated circuit (ASIC), a field programmable gate array (FPGA), or the like. Also, in embodiments, the memory system 110 may include random access memory (RAM), read only memory (ROM), or other electronic, optical, magnetic, or any other computer readable medium onto which is stored data and algorithms in a non-transitory form. The processing system 102 can also interface with a communication bus 114 to send and receive data values and/or executable instructions. The processing system 102 can include other interfaces (not depicted), such as various outputs, wireless communication interfaces, and the like.

Embodiments of the processing system 102 include a predictive system model 116 executable by one or more processors 112, where the predictive system model 116 includes a plurality of component models configured to correspond with a modeled state of the mechanical system 100. As further described herein, the predictive system model 116 can be used to generate prediction results 118 regarding future states of the mechanical system 100. The processing system 102 can capture sensor data from the sensor system 104 in an observed history 120, which may also capture data snapshots surrounding any detected failures, abnormal conditions, and/or other targeted conditions. The observed history 120 can be used offline to further refine the predictive system model 116 and develop/improve failure mode definitions 122. The predictive system model 116 can use the failure mode definitions 122 to predict and detect failure modes in real-time through trends of sensor data relative to the observed history 120, e.g., one or more parameters changing at a faster rate than expected as defined in the failure mode definitions 122.

Figure 2:
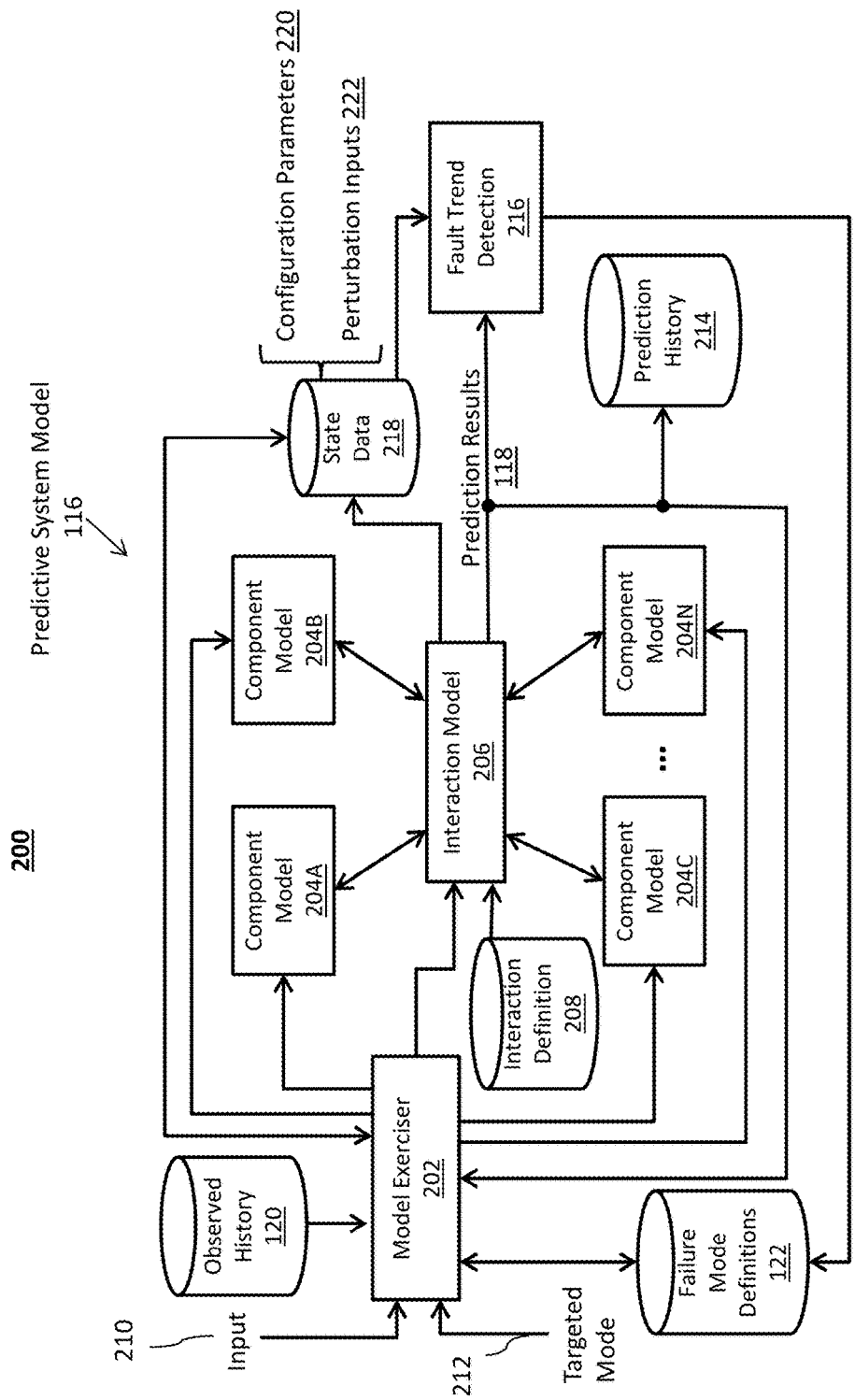
FIG. 2 illustrates a model exerciser and a predictive system model according to an embodiment.

To predict failures, the predictive system model 116 can support a training/testing mode, which may be performed as an offline process or using another instance of the processing system 102 that is not integrated with the mechanical system 100. In the example system 200 of FIG. 2, a model exerciser 202 can configure component models 204A-N of the predictive system model 116 to correspond with a modeled state of the mechanical system 100 of FIG. 1. The model exerciser 202 applies a set of perturbation inputs to one or more of the component models 204A-N to produce the prediction results 118. An interaction model 206 may use an interaction definition 208 to define mechanical and/or fluid interactions between the component models 204A-N. Although depicted separately, embodiments can merge the component models 204A-N and interaction model 206 into a single model, such as a transfer matrix model. The perturbation inputs can be sourced from observed history 120, failure mode definitions 122, and/or other input 210. A targeted mode 212 can be used as target/goal state to be achieved using a combination of configuration parameters and perturbation inputs that may be determined using discrete values and/or by stepping through value ranges.

As effects of perturbation inputs propagate through the predictive system model 116, the prediction results 118 can be captured in a prediction history 214, provided to fault trend detection 218, and fed back to the model exerciser 202 for comparison to the target mode 212. The predictive system model 116 can also capture state data 218 including values of configuration parameters 220 and perturbation inputs 222 to correlate with the prediction results 118. The state data 218 can be used by fault trend detection 216 to define and enhance trend data associated with failure modes defined in the failure mode definitions 122. For example, if the predictive system model 116 is configured into a known failure state as defined by the failure mode definitions 122, the fault trend detection 216 can characterize trends and responses that lead up to an detectable event (e.g., a vibration exceeding a maximum amplitude) to enhance predictive aspects of the predictive system model 116.

The model exerciser 202 can adjust the configuration of component models 204A-N to mimic a failure mode progression. The model exerciser 202 can also determine a best feasible path to a failure and highlight other potential issues along the path. For example; if the mechanical system 100 of FIG. 1 is a new gas turbine engine and a higher than normal vibration signature is recorded in the observed history 120 as the targeted mode 212, then the predictive system model 116 can be interrogated to determine what set of imbalances along a rotor of the engine will most closely result in achieving the targeted vibration signature.

Figure 3:
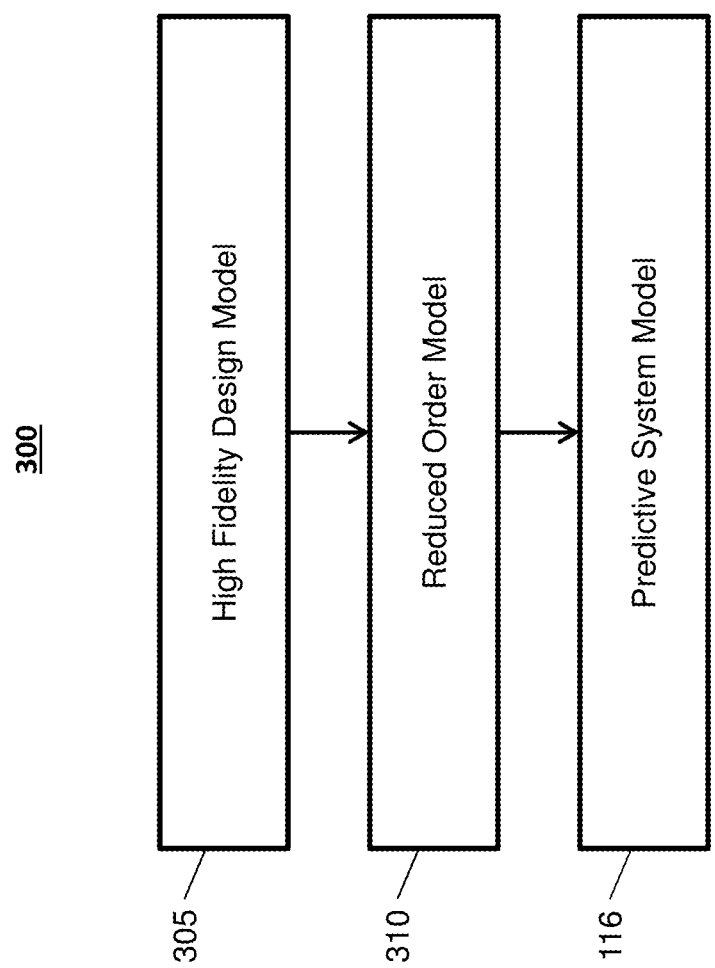
FIG. 3 illustrates a model development process according to an embodiment.

In order to provide a high degree of accuracy while reducing computational complexity, the predictive system model 116 can be developed according to the process 300 of FIG. 3. For example, a high fidelity design model 305 can be created that accurately models many aspects of the components 108A-N of FIG. 1, as well as interactions between the components 108A-108N at the system level. The high fidelity design model 305 can be culled to a reduced order model 310, for instance, by removing higher order terms (e.g., above second-order effects). The reduced order model 310 can be used as the predictive system model 116 or can be further refined and trained. For instance, test cases can be run on the high fidelity design model 305 and on the reduced order model 310 to observe differences in results. Where differences between the results of the models 305 and 310 vary by more than a threshold amount (e.g., >5%), one or more corrective terms can be added to the predictive system model 116 to account for the variation (e.g., resonant effects). Embodiments simplify the predictive system model 116 as compared to the high fidelity design model 305 in order to operate in real-time or near real-time.

Figure 4:
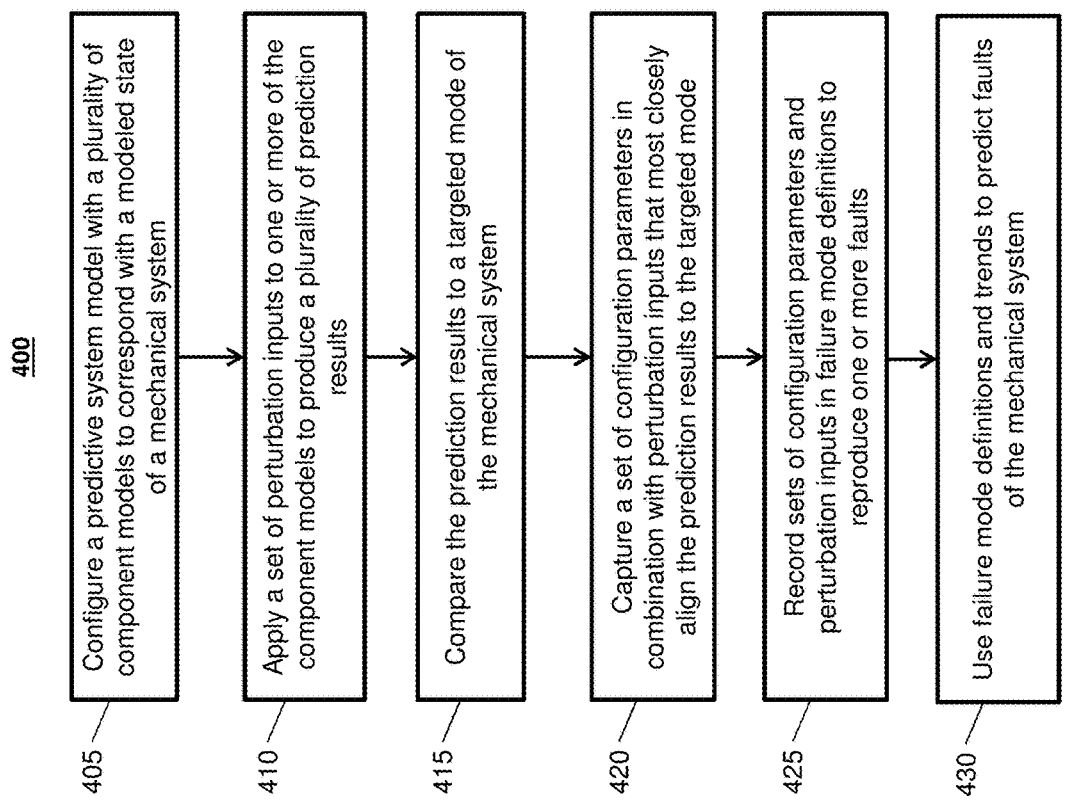
FIG. 4 illustrates a process of using a predictive system model according to an embodiment.

FIG. 4 illustrates a process 400 of using the predictive system model 116 according to an embodiment and is described in reference to FIGS. 1-4. The process 400 can be performed by the processing system 102 as integrated with (e.g., attached to) the mechanical system 100 or using a separate instance of the processing system 102 that is not integrated with the mechanical system 100.

At block 405, component models 204A-N of the predictive system model 116 are configured to correspond with a modeled state of the mechanical system 100. The predictive system model 116 can define mechanical and fluid interactions between the component models 204A-N according to interaction definitions 208. The modeled state of the mechanical system 100 can be a degraded condition of the mechanical system 100 or a modification to the mechanical system 100 (e.g., repositioning, substitution, or removal of one or more components 108A-N). Configuration parameters can be established by the model exerciser 202 to match a desired configuration or explore configuration options by stepping through multiple possible configurations.

At block 410, a set of perturbation inputs is applied to one or more of the component models 204A-N to produce a plurality of prediction results 118. The perturbation inputs can be applied as a fixed value or as a time varying function (e.g., a step, a ramp, a pulse, or an arbitrary profile).

At block 415, the prediction results 118 are compared to a targeted mode 212 of the mechanical system 100. The targeted mode 212 can correspond to an observed condition of the mechanical system 100 from sensor data. For example, the targeted mode 212 may be a rate of particle detection at an oil debris monitor sensor or a level of vibration at a specific frequency.

At block 420, a set of configuration parameters 220 of the mechanical system 100 is captured in combination with one or more of the perturbation inputs 222 that most closely results in the prediction results 118 matching the targeted mode 212 of the mechanical system 100. For instance, as the model exerciser 202 varies values of the configuration parameters 220 and/or the perturbation inputs 222, the values can be captured as state data 218 when the prediction results 118 match or are within a threshold value (e.g., within 10%) of the targeted mode 212.

At block 425, associations between fault conditions of the mechanical system 100 and the set of configuration parameters 220 and perturbation inputs 222 can be captured in the failure mode definitions 122 to reproduce one or more faults. A neural network can be used to interpolate conditions between the failure mode definitions 122. A history of the prediction results 118 can be captured and observed faults of the mechanical system 100 may be compared to the prediction results 118 in the prediction history 214 to train the predictive system model 116.

At block 430, the failure mode definitions 122 and trends can be used to predict faults of the mechanical system 100. Fault trend detection 216 can observe one or more progressive sequences of the configuration parameters 220 and perturbation inputs 222 that result in each of the one or more faults in the failure mode definitions 122. An instance of the predictive system model 116 can be implemented in the processing system 102 of the mechanical system 100 to perform fault prediction using the failure mode definitions 122 in real-time. The failure mode definitions 122 can be initially established using historical data and/or domain experts. Versions of the failure mode definitions 122 can be collectively analyzed from various instances of the mechanical system 100 having different service histories and/or operating environments to further enhance the trend and fault definitions.

The terminology used herein is for the purpose of describing particular embodiments only and is not intended to be limiting of the embodiments. While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate with the spirit and scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

What is claimed is:

1. A method comprising:
configuring, in a processing system of a mechanical system, a predictive system model with a plurality of component models to correspond with a modeled state of a mechanical system, wherein the predictive system model is a reduced order model derived from one or more higher fidelity models of the mechanical system by removing higher order terms above second-order effects;
applying a set of perturbation inputs to one or more of the component models to produce a plurality of prediction results;
comparing the prediction results to a targeted mode of the mechanical system, the targeted mode defining a target/goal state to be achieved;
capturing, in a memory system of the processing system, a set of configuration parameters of the mechanical system in combination with one or more of the perturbation inputs that most closely results in the prediction results matching the targeted mode of the mechanical system, wherein associations between fault conditions of the mechanical system and the set of configuration parameters and perturbation inputs are captured in failure mode definitions to reproduce one or more faults; and
using the failure mode definitions to predict and detect one or more failure modes of the mechanical system in real-time through trends of sensor data relative to an observed history comprising prediction and detection of one or more parameters changing at a faster rate than expected as defined in the failure mode definitions.

2. The method of claim 1, wherein the modeled state of the mechanical system is a degraded condition of the mechanical system.

3. The method of claim 1, wherein the targeted mode corresponds to an observed condition of the mechanical system from sensor data.

4. The method of claim 1, wherein the predictive system model defines mechanical and fluid interactions between the component models.

5. The method of claim 1, further comprising:
performing fault trend detection to observe one or more progressive sequences of the configuration parameters and perturbation inputs that result in each of the one or more faults.

6. The method of claim 1, further comprising:
using a neural network to interpolate conditions between the failure mode definitions.

7. The method of claim 1, further comprising:
capturing a history of the prediction results; and
comparing observed faults of the mechanical system to the prediction results to train the predictive system model.

8. A processing system operably coupled to a sensor system of a mechanical system, the processing system comprising:
a memory system; and
one or more processors configured to execute a plurality of instructions comprising:
a predictive system model comprising a plurality of component models configured to correspond with a modeled state of the mechanical system, wherein the predictive system model is a reduced order model derived from one or more higher fidelity models of the mechanical system by removing higher order terms above second-order effects, and the predictive system model uses the failure mode definitions to predict and detect one or more failure modes of the mechanical system in real-time through trends of sensor data relative to an observed history comprising prediction and detection of one or more parameters changing at a faster rate than expected as defined in the failure mode definitions; and
a model exerciser operable to apply a set of perturbation inputs to one or more of the component models to produce a plurality of prediction results, compare the prediction results to a targeted mode of the mechanical system, and capture in the memory system a set of configuration parameters of the mechanical system in combination with one or more of the perturbation inputs that most closely results in the prediction results matching the targeted mode of the mechanical system, wherein the targeted mode defines a target/goal state to be achieved, and wherein associations between fault conditions of the mechanical system and the set of configuration parameters and perturbation inputs are captured in the failure mode definitions to reproduce one or more faults.

9. The processing system of claim 8, wherein the modeled state of the mechanical system is a degraded condition of the mechanical system.

10. The processing system of claim 8, wherein the targeted mode corresponds to an observed condition of the mechanical system from sensor data.

11. The processing system of claim 8, wherein the predictive system model defines mechanical and fluid interactions between the component models.

12. The processing system of claim 8, further comprising fault trend detection to observe one or more progressive sequences of the configuration parameters and perturbation inputs that result in each of the one or more faults.

13. The processing system of claim 8, wherein a neural network is used to interpolate conditions between the failure mode definitions.

14. The processing system of claim 8, wherein the processing system is further operable to capture a history of the prediction results in the memory system and compare observed faults of the mechanical system to the prediction results to train the predictive system model.

* * * * *